(12) United States Patent
Kaner et al.

(10) Patent No.: US 7,850,798 B2
(45) Date of Patent: Dec. 14, 2010

(54) FLASH WELDING OF CONDUCTING POLYMER NANOFIBERS

(75) Inventors: Richard B. Kaner, Pacific Palisades, CA (US); Jiaxing Huang, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 244 days.

(21) Appl. No.: 11/255,133

(22) Filed: Oct. 19, 2005

(65) Prior Publication Data
US 2006/0237694 A1 Oct. 26, 2006

Related U.S. Application Data

(60) Provisional application No. 60/621,350, filed on Oct. 21, 2004.

(51) Int. Cl.
B29C 65/14 (2006.01)
(52) U.S. Cl. .................... 156/62.2; 156/272.2
(58) Field of Classification Search ................ 156/62.2, 156/62.4, 272.2, 275.1, 275.5; 216/7; 977/788, 977/840, 888, 895
See application file for complete search history.

(56) References Cited

U.S. PATENT DOCUMENTS

| | | | | | |
|---|---|---|---|---|---|
| 3,271,220 | A | * | 9/1966 | Geen | 156/180 |
| 3,335,021 | A | * | 8/1967 | Morgan | 428/189 |
| 3,338,693 | A | * | 8/1967 | Letter | 65/17.3 |
| 4,151,023 | A | * | 4/1979 | Platt et al. | 156/62.2 |
| 4,214,935 | A | * | 7/1980 | Nagai | 156/272.2 |
| 5,069,820 | A | * | 12/1991 | Jen et al. | 252/500 |
| 5,346,649 | A | * | 9/1994 | Karna et al. | 252/500 |
| 5,540,862 | A | * | 7/1996 | Cao et al. | 252/500 |
| 6,991,702 | B2 | * | 1/2006 | Kim | 156/379.6 |
| 2001/0045547 | A1 | * | 11/2001 | Senecal et al. | 252/501.1 |
| 2003/0040244 | A1 | * | 2/2003 | Yamamoto et al. | 442/415 |

(Continued)

OTHER PUBLICATIONS

Conklin, J. A., Huang, S. C., Huang, S. M., Wen, T. L. & Kaner, R. B. "Thermal-Properties of Polyaniline and Poly(Aniline-Co-O-Ethylaniline)", *Macromolecules* 28, 6522-6527 (1995).

(Continued)

*Primary Examiner*—Michael A Tolin
(74) *Attorney, Agent, or Firm*—Koppel, Patrick, Heybl & Dawson; Michael J. Ram

(57) ABSTRACT

The welding of certain polymeric nanofibers can be accomplished by exposure to an intense short burst of light, such as is provided by a camera flash, resulting in an instantaneous melting of the exposed fibers and a welding of the fibers where they are in contact. The preferred nanofibers are composed of conjugated, conducting polymers, and derivatives and polymer blends including such materials. Alternatively, the nanofibers can be composed of colored thermoplastic polymeric fibers or opaque polymers by proper selection of the frequency or frequency range and intensity (power) of the light source. The flash welding process can also be used to weld nanofibers which comprise a blend of polymeric materials where at least one of the materials in the blend used to form the nanofiber is a conductive, conjugated polymer or a suitable colored thermoplastic. Alternatively the material blend used to form the nanofibers may comprise a polymeric material containing a colored additive, which is not necessarily a polymer, for example carbon black, or a colored nanoparticulate organic or inorganic material, dye or pigment.

15 Claims, 6 Drawing Sheets

U.S. PATENT DOCUMENTS

2003/0137083 A1* 7/2003 Ko et al. ................. 264/449

OTHER PUBLICATIONS de Albuquerque, J. E., Melo, W. L. B. & Faria, R. M. "Determination Of Physical Parameters Of Conducting Polymers By Photothermal Spectroscopies", *Rev. Sci. Instrum. 74*, 306-308 (2003).

Ding, L. L., Wang, X. W. & Gregory, R. V., "Thermal Properties Of Chemically Synthesized Polyaniline (EB) Powder", *Synth. Met. 104*, 73-78 (1999).

Huang, J. X. & Kaner R. B. "A General Chemical Route To Polyaniline Nanofibers", *J. Am. Chem. Soc. 126*, 851-855 (2004).

Huang, S. C., Ball, I. J. & Kaner, R. B. "Polyaniline Membranes For Pervaporation Of Carboxylic Acids and Water" *Macromolecules 31*, 5456-5464 (1998).

Huang, W. S., Humphrey, B. D. & MacDiarmid, A. G., "Polyaniline, a Novel Conducting Polymer", *J. Chem. Soc. Faraday Trans. 82*, 2385 (1986).

Kieffel, Y., Travers, J. P., Ermolieff, A. & Rouchon, D. "Thermal Aging Of Undoped Polyaniline: Effect Of Chemical Degradation On Electrical Properties", *J. Appl. Polym. Sci. 86*, 395-404 (2002).

Liu, G. & Freund, M. S. "New Approach For The Controlled Cross-Linking Of Polyaniline: Synthesis And Characterization", *Macromolecules*, 5660-5665 (1997).

MacDiarmid, A. G. "Polyaniline And Polypyrrole: Where Are We Headed?" *Synth. Met. 84*, 27-34 (1997).

Mathew, R., Mattes, B. R. & Espe, M. P. "A Solid State NMR Characterization of Cross-Linked Polyaniline Powder" *Synth. Met. 131*, 141-147 (2002).

Pandey, S. S., Gerard, M., Sharma, A. L. & Malhotra, B. D., "Thermal Analysis Of Chemically Synthesized Polyemeraldine Base", *J. Appl. Poly. Sci. 75*, 149-155 (2000).

Rodrigues, P. C., de Souza, G. P., Neto, J. D. D. & Akcelrud, L. "Thermal Treatment And Dynamic Mechanical Thermal Properties Of Polyaniline", *Polymer 43*, 5493-5499 (2002).

Sansinena, J. M., Gao, J. B. & Wang, H. L., "High-Performance, Monolithic Polyaniline Electrochemical Actuators" *Adv. Funct. Mater. 13*, 703-709 (2003).

Tan, H. H., Neoh, K. G., Liu, F. T., Kochergineky, N. & Kang, E. T. "Crosslinking And Its Effects On Polyaniline Films", *J. Appl. Polym. Sci. 80*, 1-9 (2001).

Toyoda, T. & Nakamura, H. "Photoacoustic-Spectroscopy Of Polyaniline Films", *Jpn. J. Appl. Phys. 34*, 290-2910 (1995).

Wang, H. L., Gao, J. B., Sansinena, J. M. & McCarthy, P., "Fabrication And Characterization Of Polyaniline Monolithic Actuators Based On A Novel Configuration: Integrally Skinned Asymmetric Membrane" *Chem. Mater. 14*, 2546-2552 (2002).

Wei, Y. & Hsueh, K. F., "Thermal-Analysis Of Chemically Synthesized Polyaniline And Effects Of Thermal Aging On Conductivity", *J. Polym. Sci., Part A: Polym. Chem. 27*, 4351-4363 (1989).

P. M. Ajayan, N. Terrones, A. de la Guardia, V. Huc, N. Grobert, B. Q. Wei, H. Lezec, G. Ramanath, T. W. Ebbesen "Nanotubes in a Flash-Ignition and Reconstruction" *Science 296* 705 (2002).

Wang, N., Yao, B. D., Chan, Y. F. & Zhang, X. Y. "Enhanced Photothermal Effect In Si Nanowires", *Nono Lett. 3*, 475-477 (2003).

Wallace, Gordon G. et al, "Conjugated Polymers: New Materials For Photovoltaics", *Chemical Innovation*, 30, (Apr. 2000).

Li, Dan et al., "Nanomaterials, Welding and Patterning In A Flash", *Nature Publishing Group*, 3, 753-754 (Nov. 2004).

De Albuquerque, J. E., Melo, W. L. B. & Feria, R. M. "Photopyroelectric Spectroscopy Of Polyaniline Films", *J. Polym. Sci., Part B: Polym. Phys. 38*, 1294-1300 (2000).

Huang, J. X., Virji, S., Weiller, B. H. & Kaner, R. B. "Polyaniline Nanofibers: Facile Synthesis And Chemical Sensors", *J. Am. Chem. Soc. 125*, 314-315 (2003).

Gao, J. B., Sansinena, J. M. & Wang, H. L. "Tunable Polyaniline Chemical Actuators" *Chem. Mater. 15*, 2411-2418 (2003).

Gao, J. B., Sansinena, J. M. & Wang, H. L. "Chemical Vapor Driven Polyaniline Sensor/Actuators" *Synth. Met. 135*, 809-810 (2003)).

Smits, J.; Wincheski, B., Namkung, M., Crooks, R. & Louie, R. "Response Of Fe Powder, Purified And As-Produced Hipco Single-Walled Carbon Nanotubee to Flash Exposure", *Mater. Sci.& Eng., A 358*, 384-389 (2003).

Braidy, N., Bottom, G. A. & Adronov, A. "Oxidation of Fe Nanoparticles Embedded In Single-Walled Carbon Nanotubes By Exposure To A Bright Flash Of White Light", *Nano Lett. 2*, 1277-1280 (2002).

* cited by examiner

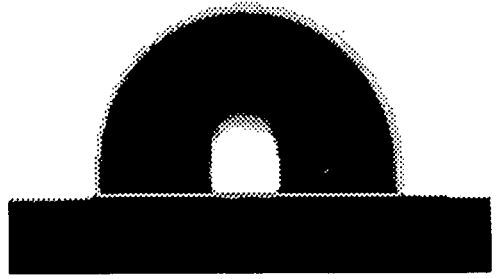
FIGURE 6　　　　　　FIGURE 7
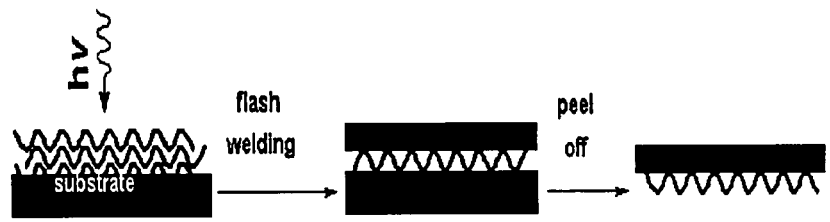
FIGURE 9
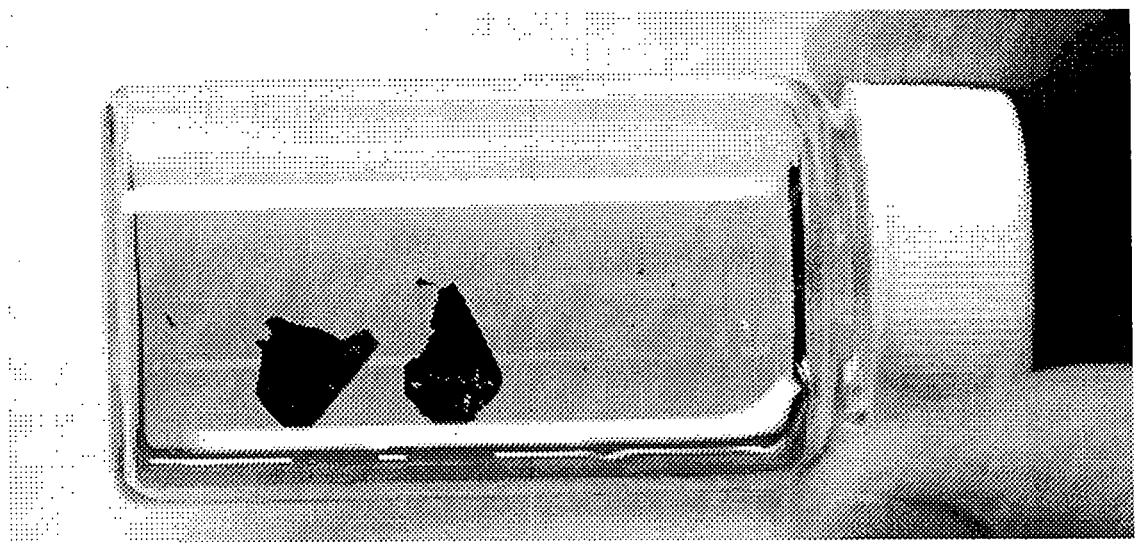
FIGURE 10

FLASH WELDING OF CONDUCTING POLYMER NANOFIBERS

Benefit is claimed of Provisional Patent Application Ser. No. 60/621,350 filed Oct. 21, 2004.

This invention was made with support of a grant from Microelectronics Advanced Research Corp. (MACRO)

The invention was developed in part with funding from the Microelectronics Advanced Research Corporation (MARCO) and its Focus Center on Function Engineered NanoArchitectonics (FENA).

The present invention relates to methods for welding polymeric nanofibers and structures resulting from the welding process.

BACKGROUND

The absorption of light by certain materials can generate heat through nonradiative energy dissipation and exothermic photochemical reactions (Rosencwaig, A. *Photoacoustics and Photoacoustic Spectroscopy* (John Wiley & Sons, New York, 1990) In nanostructured materials, the heat generated through photothermal processes are confined within the individual nanostructures because heat transfer to neighboring nanostructures and the environment is slow. This enables unprecedented photothermal effects that cannot be observed in bulk materials, especially when a strong, pulsed light source is used (P. M. Ajayan, M. Terrones, A. de la Guardia, V. Huc, N. Grobert, B. Q. Wei, H. Lezec, G. Ramanath, T. W. Ebbesen "Nanotubes in a Flash—Ignition and Reconstruction" *Science* 296 705 (2002); Wang, N., Yao, B. D., Chan, Y. F. & Zhang, X. Y. "Enhanced Photothermal Effect In Si Nanowires", *Nano Lett.* 3, 475-477 (2003)).

Polyaniline is a deeply colored conjugated polymer that has been extensively studied during the past twenty-five years for its electrical properties (MacDiarmid, A. G. "Polyaniline And Polypyrrole: Where Are We Headed?" *Synth. Met.* 84, 27-34 (1997). In powder form, undoped polyaniline is dark blue. When doped with acids it changes to a conducting form and the color changes to a deep green (Huang, W. S., Humphrey, B. D. & MacDiarmid, A. G. "Polyaniline, a Novel Conducting Polymer", *J. Chem. Soc. Faraday Trans.* 82, 2385 (1986)) Since polyaniline has extremely low luminescence efficiency, it converts most of the energy absorbed from light into heat (de Albuquerque, J. E., Melo, W. L. B. & Faria, R. M. "Determination Of Physical Parameters Of Conducting Polymers By Photothermal Spectroscopies", *Rev. Sci. Instrum.* 74, 306-308 (2003); De Albuquerque, J. E., Melo, W. L. B. & Faria, R. M. "Photopyroelectric Spectroscopy Of Polyaniline Films", *J. Polym. Sci., Part B: Polym. Phys.* 38, 1294-1300 (2000); Toyoda, T. & Nakamura, H. "Photoacoustic-Spectroscopy Of Polyaniline Films", *Jpn. J. Appl. Phys.* 34, 2907-2910 (1995).

Applicants had previously reported the formation and use of polyaniline powder and nanofibers (Huang, J. X. & Kaner, R. B. "A General Chemical Route To Polyaniline Nanofibers", *J. Am. Chem. Soc.* 126, 851-855 (2004); Huang, J. X., Virji, S., Weiller, B. H. & Kaner, R. B. "Polyaniline Nanofibers: Facile Synthesis And Chemical Sensors", *J. Am. Chem. Soc.* 125, 314-315 (2003).

SUMMARY

Bursts of high intensity light are used to weld together polymeric nanofibers to form a smooth continuous film.

BRIEF DESCRIPTION OF THE DRAWINGS

FIG. 6 shows the water contact angle on a mat of nanofibers.

FIG. 7 shows the water contact angle on the mat of nanofibers of FIG. 6 following flash welding.

FIG. 9 is a schematic diagram illustrating the steps in the process of flash welding of a mat of nanofibers.

FIG. 10 is a photograph showing the insolubility of flash welded nanofibers.

DISCUSSION

Figure 1:
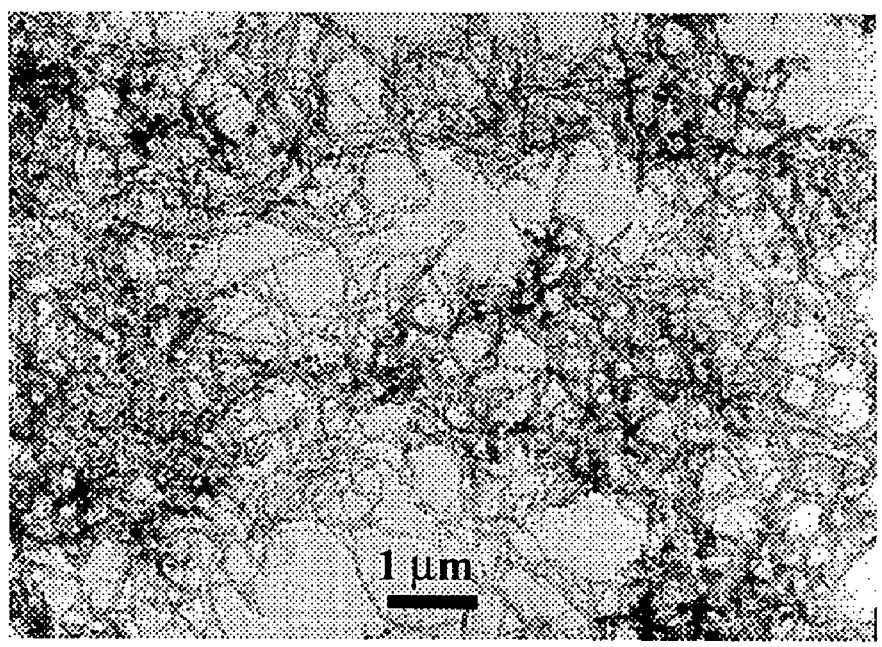
FIG. 1 is a TEM image of a network of polyaniline nanofibers.
Figure 2:
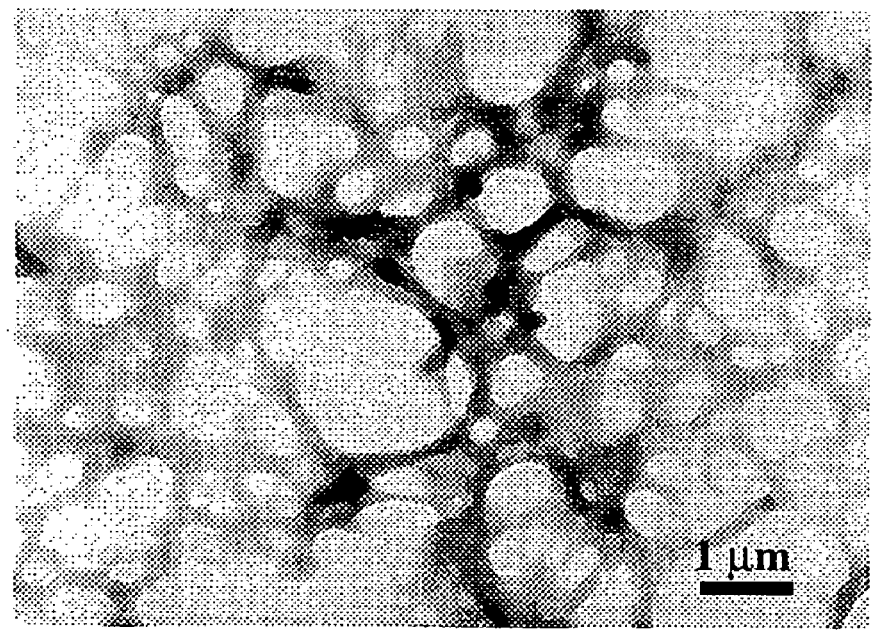
FIG. 2 is a TEM image of the network of polyaniline nanofibers of FIG. 1 immediately following exposure of said network of fibers to a camera flash.

Applicant has now discovered that certain polymeric nanofibers undergo an unusual and unexpected enhanced photothermal phenomenon when exposed to an intense short burst of light, such as is provided by a camera flash, resulting in an instantaneous melting of the exposed fibers and a welding of the fibers where they are in contact. The preferred nanofibers are composed of conjugated (alternating single and double carbon-carbon and sometimes carbon-nitrogen bonds), conducting polymers, including, but not limited to, polyaniline, poly(N-vinylcarbazole), polyacetylene, polypyrrole, polythiophene, poly(2-vinylpyridine) and poly(p- phenylenevinylene), and derivatives and polymer blends including one or more of these materials. Alternatively, they can be composed of colored, more preferably dark colored, thermoplastic polymeric fibers. However, the phenomena can also be demonstrated on light colored or opaque polymers by proper selection of the frequency or frequency range and intensity (power) of the light source. The flash welding process can also be used to weld nanofibers which comprise a blend of polymeric materials where at least one of the materials in the blend used to form the nanofiber is a conductive, conjugated polymer or a suitable colored thermoplastic. Alternatively the material blend used to form the nanofiber may comprise a polymeric material containing a colored additive, which is not necessarily a polymer, for example carbon black, or a colored nano-particulate organic or inorganic material, dye or pigment. As an example, when exposed to a camera flash, preferably close, i.e. within several centimeters, a sample of powdered polyaniline or nanofiber polyaniline, in either doped or dedoped form, responds audibly with distinct popping sounds and the concomitant formation of agglomerates within the exposed area. A mat of polyaniline nanofibers, when irradiated by a flash of high intensity light, such as exposure to a flash from camera lighting, instantaneously melts and solidifies to form a smooth and continuous film over the exposed area of the originally random network of nanofibers. This photothermal effect can be used to form asymmetric nanofiber films, to rapidly melt-blend polymer-polymer nanocomposites and to photo-pattern polymer nanofiber films. FIGS. 1 and 2 are transmission electron microscopy (TEM) images showing a network of polyaniline nanofibers prior to and immediately after exposure to the light flash (flash light unit attached to an Olympus D550 digital camera), FIG. 2 shows the same structure melted and merged together. The short burst of high intensity light referred to herein is intended to cover a burst of light of from about 1 milliseconds to about 10 milliseconds, preferably about 5 msec with an intensity (power) of from about 0.1 J/cm$^2$ to about 1 J/cm$^2$ and a frequency in the range from about 200 nm to about 900 nm (visible light region). However, a burst of light as short as 1 microsecond can also be used depending on the chemical nature of the nanofiber and the frequency of the burst of light.

EXAMPLE 1

Polyaniline nanofibers were prepared using interfacial polymerization as follows:

Two approaches were shown to produce suitable nanofibers. In a first approach the polymerization reaction was conducted in a heterogeneous biphasic system with the polymerization reaction occurring at the interface. The polyaniline was formed in its emeraldine salt form so that it diffuses away from the reactive interface into the water phase as it is formed. This then makes new reaction sites available at the interface, avoiding overgrowth and resulting in nanofibers which do not continue to grow as the polymerization reaction continues. The nanofibers can then be collected from the water phase without interfering with the continued production of new nanofibers. A second method to prevent overgrowth and maintain the polyaniline in its nanofiber form is to rapidly mix the monomer and initiator solutions. When the reaction starts, the initiator molecules are consumed rapidly by the polymerization reaction to the point where the initiator is depleted after nanofibers are formed, suppressing overgrowth due to lack of initiator molecules.

Figure 3:
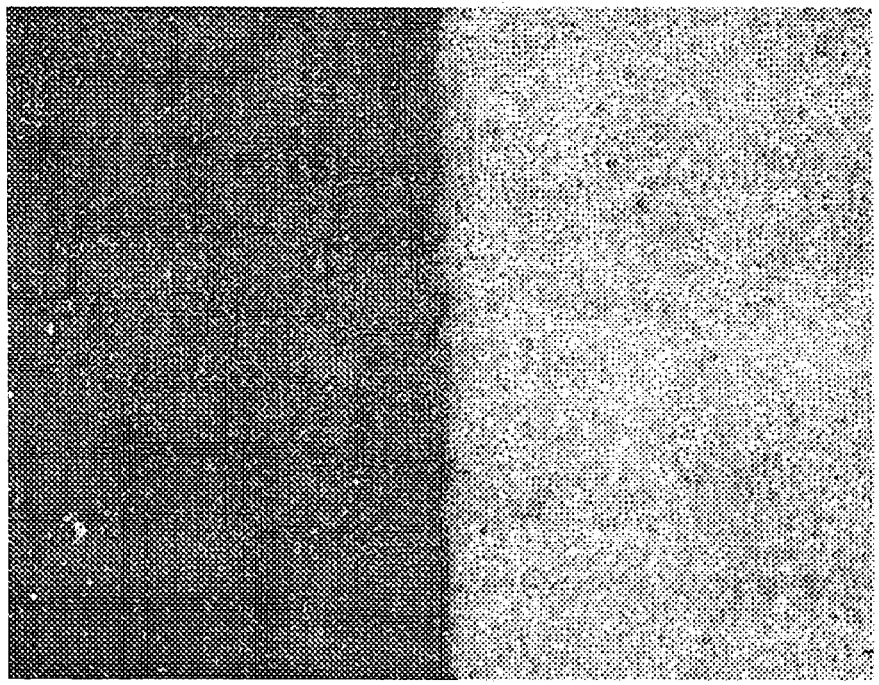
FIG. 3 is optical microscope image of a mat of nanofibers produced by casting nanofibers on a substrate showing unexposed (left portion) and following exposure to a photo flash (right portion).
Figure 4:
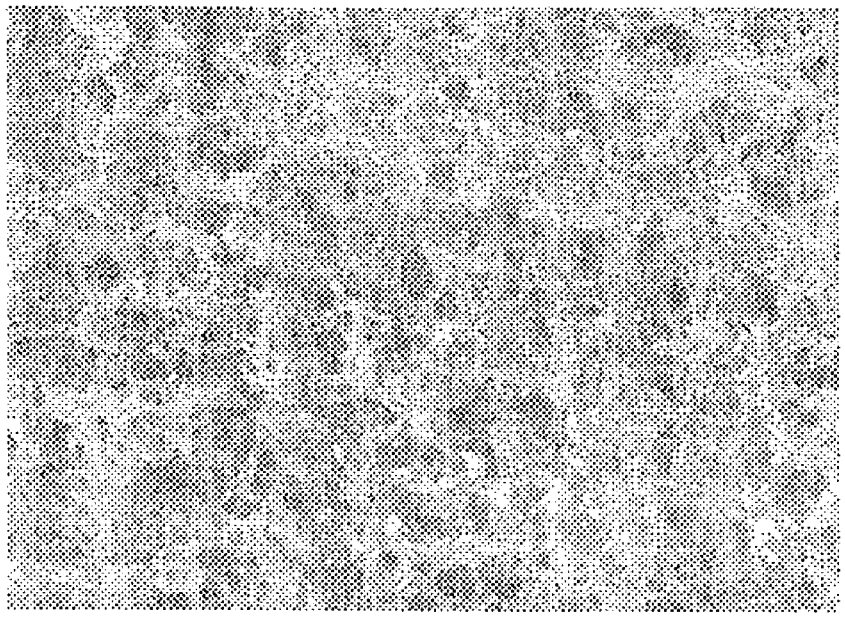
FIG. 4 is an SEM image of the mat of FIG. 3 prior to exposure.
Figure 5:
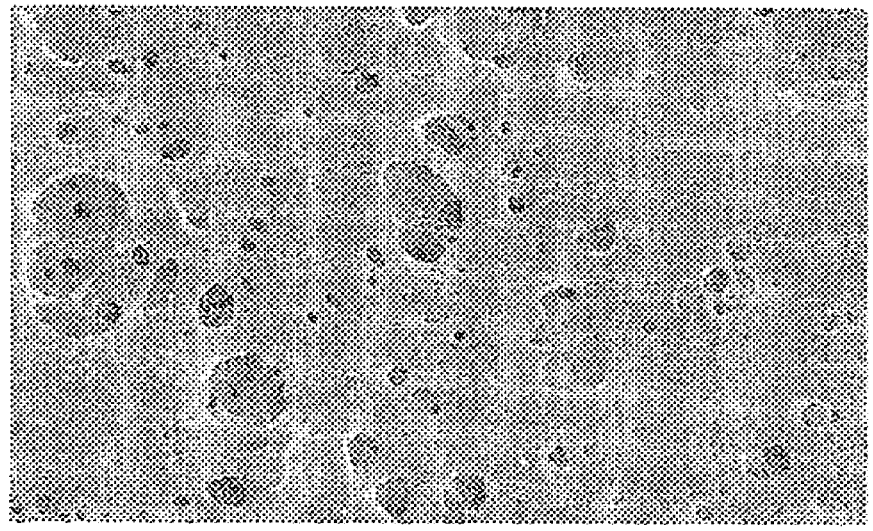
FIG. 5 is an SEM image of the flash welded nanofibers shown in FIG. 3 after exposure.

Referring to FIG. 9, a random network of polyaniline nanofibers were cast from a water suspension onto a flat substrate (a silicon wafer). Upon drying, a random matt of nanofibers was obtained. FIG. 4 is an SEM (19,000×) image, of the random mat prior to exposure. After exposure for about 5 milliseconds to a standard flash unit attached to a digital camera (Olympus D-550) the film became welded by the flash of light to create a continuous, smooth, shiny film. FIG. 5 is a 19,000× SEM image of the flash welded mat. FIG. 3 is an optical microscopic image (50×) of the random mat unexposed (left portion) and exposed (right portion). The change in surface roughness can be clearly seen with the naked eye. The reflectance mode optical microscope images (FIG. 3) show a distinct contrast in reflectivity between the un-welded and welded areas of the nanofiber film. The scanning electron microscopy (SEM) images reveal that the nanofibers on the surface of the mat (FIG. 4) are welded together to create a continuous film (FIG. 5). The pin-holes correspond to the free-volume in the nanofiber film before welding. The difference in surface roughness before and after welding was also found to alter the wettability of the film. For example, before flash welding, a porous, undoped nanofiber film, although hydrophobic, absorbs water droplets like fibrous filter paper (FIG. 6). However, after flash welding, the less porous surface repels water with a contact angle of 99° due to its bulk hydrophobic nature (FIG. 7).

Figure 8:
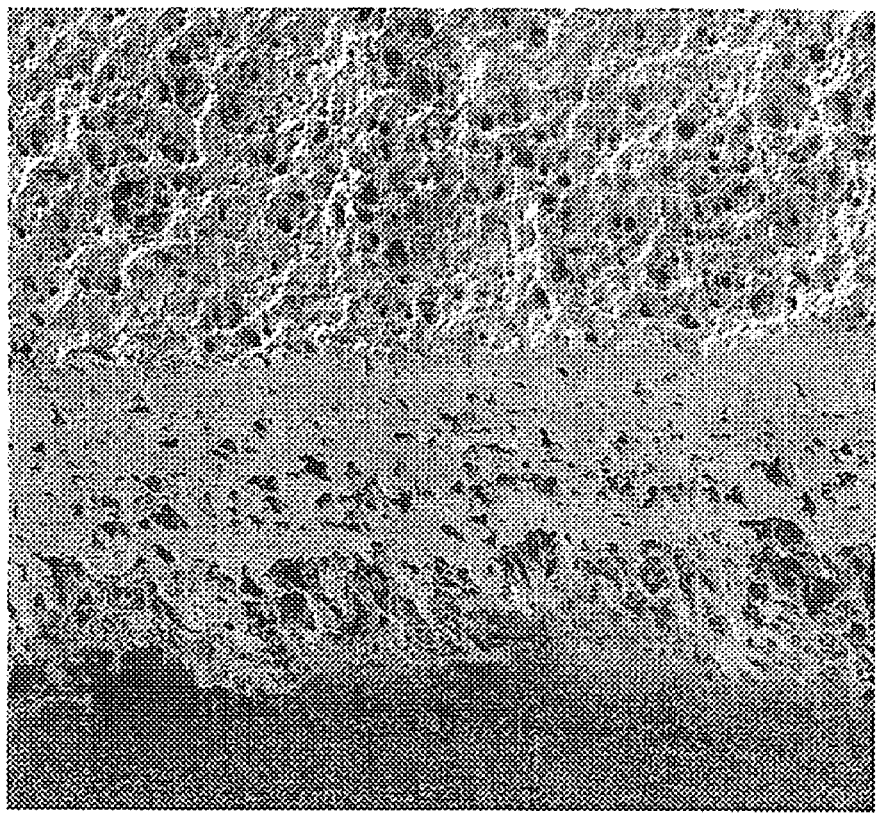
FIG. 8 is a cross-sectional SEM image of a flash welded mat.
Figure 16:
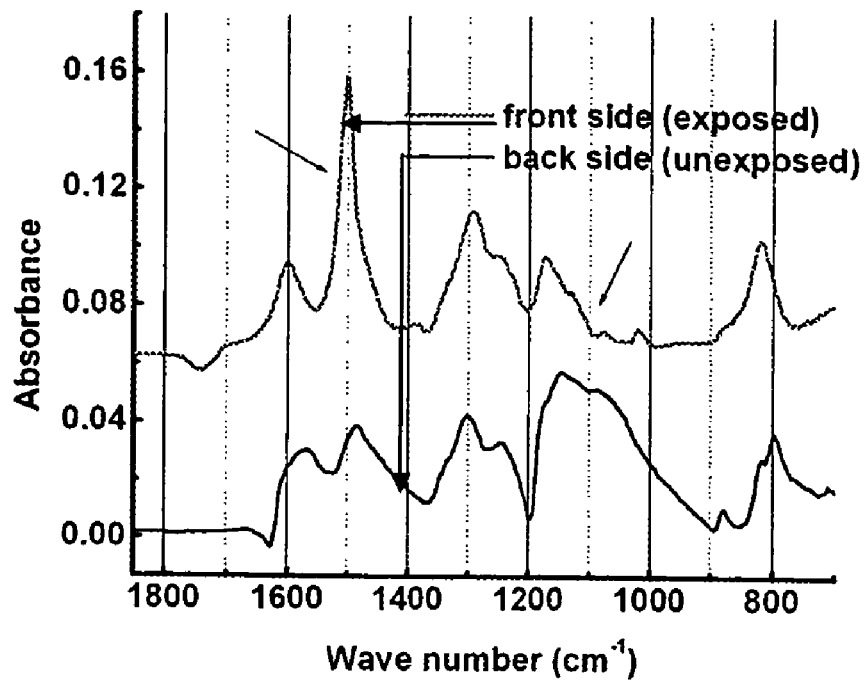
FIG. 16 is an attenuated total reflectance-infrared (ATR-IR) spectra showing the total infrared spectra of the front (flash welded) and rear (non-welded mat) surfaces of polyaniline nanofiber following exposure of the front surface to a camera flash.

It was also discovered that the flash welded films can be readily removed from their substrates using water. They can also be peeled from the substrate by adhering a corner of the film to adhesive cellophane tape and using the tape to peel back the welded film. The nanofibers on the exposed side are welded together (top portion of FIG. 8), while those on the unexposed side remain intact as seen in the lower portion of FIG. 8, which is an SEM cross-sectional image of a flash welded film. Fourier transform infrared (FTIR) spectroscopy studies (FIG. 16) of both sides of the film when compared to published data on the chemistry of polyaniline (Ding, L. L., Wang, X. W. & Gregory, R. V., "Thermal Properties Of Chemically Synthesized Polyaniline (EB) Powder", *Synth. Met.* 104, 73-78 (1999); Pandey, S. S., Gerard, M., Sharma, A. L. & Malhotra, B. D., "Thermal Analysis Of Chemically Synthesized Polyemeraldine Base", *J. Appl. Poly. Sci.* 75, 149-155 (2000); Wei, Y. & Hsueh, K. F., "Thermal-Analysis Of Chemically Synthesized Polyaniline And Effects Of Thermal Aging On Conductivity", *J. Polym. Sci., Part A: Polym. Chem.* 27, 4351-4363 (1989); Mathew, R., Mattes, B. R. & Espe, M. P. "A Solid State NMR Characterization Of Cross-Linked Polyaniline Powder" *Synth. Met.* 131, 141-147 (2002)) indicate that the polyaniline nanofibers became chemically cross-linked upon flash irradiation, which results in a dramatic change in solubility. For example, while polyaniline nanofibers are soluble in N,N-dimethylformamide (DMF), which is a good solvent for polyaniline nanofibers, the flash welded polyaniline nanofiber film, now also cross-linked, is no longer soluble in DMF, as demonstrated by pieces of flash welded polyaniline nanofibers suspended in DMF (FIG. 10). The solvent acquires a slight blue color which is a result of a small quantity of dissolved polyaniline which was not exposed to the flash and therefore was not cross-linked.

Morphological changes in the samples were observed by transmission electron microscopy (JEOL 100CX), scanning electron microcopy (JEOL 6700, Philips XL 30) and optical microscopy (Zeiss Axiotech 100). The wettability of the films was studied using a contact angle analyzer (First Ten Angstroms, FTA 125). FT-IR spectra of the nanofiber films were taken in attenuated total reflectance mode (Nicolet Avatar 360).

Flash welding is a very convenient method for making an asymmetric film. Asymmetric films are particularly useful in many applications including separation membranes (Huang, S. C., Ball, I. J. & Kaner, R. B. "Polyaniline Membranes For Pervaporation Of Carboxylic Acids And Water" *Macromolecules* 31, 5456-5464 (1998); Nunes, S. P. & Peinemann, K.-V. *Membrane Technology in the Chemical Industry*, Wiley-VCH, Weinheim, 2001), chemical sensors and actuators (Sansinena, J. M., Gao, J. B. & Wang, H. L., "High-Performance, Monolithic Polyaniline Electrochemical Actuators" *Adv. Funct. Mater.* 13, 703-709 (2003); Wang, H. L., Gao, J. B., Sansinena, J. M. & McCarthy, P., "Fabrication And Characterization Of Polyaniline Monolithic Actuators Based On A Novel Configuration: Integrally Skinned Asymmetric Membrane" *Chem. Mater.* 14, 2546-2552 (2002); Gao, J. B., Sansinena, J. M. & Wang, H. L. "Tunable Polyaniline Chemical Actuators" *Chem. Mater.* 15, 2411-2418 (2003); Gao, J. B., Sansinena, J. M. & Wang, H. L. "Chemical Vapor Driven Polyaniline Sensor/Actuators" *Synth. Met.* 135, 809-810 (2003)). As shown in these references, asymmetric films of polyaniline are usually made via multiple, relatively time consuming steps. Photothermally induced welding, which had not been previously observed, offers a rapid route to create free-standing asymmetric films.

Figure 11:
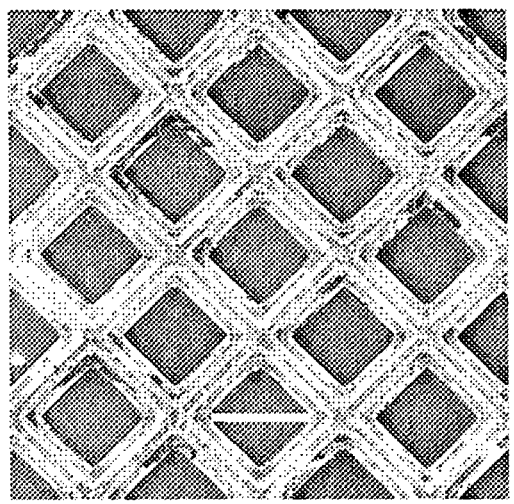
FIG. 11 shows a copper grid placed on a mat of nanofibers.
Figure 12:
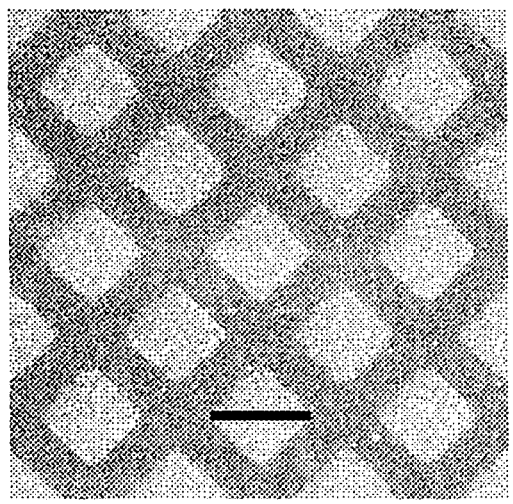
FIG. 12 shows the mat of nanofiber of FIG. 11 after flash welding and removal of the copper grid.

Another unique advantage of flash welding is its ability to selectively weld certain areas on a nanofiber film using a pre-designed photomask to imprint a pattern, defined by the photomask, into the film. FIG. 12 shows a pattern developed on a flash welded nanofiber film that is identical to the mask, shown in FIG. 11 placed over the mat prior to exposure to the flash (Scale bars=100 μm). The high contrast between the resulting patterns is due to a change in reflectivity induced by flash welding. The areas exposed to the camera flash (the squares) are smooth and therefore appear bright gold due to the reflectance of incident light. The protected areas (the lines), which comprise non-welded, non-cross-linked nanofibers, retain the green color of the nanofibers and appear darker since the rough surface scatters light and yields low reflectance. Scanning electron microscopy studies of the patterned, flash welded mat indicates that it has morphological differences comparable to FIGS. 4 and 5. Since many properties of polyaniline (i.e. conductivity, surface area, optical absorption, permeability and thermal stability) change after cross-linking (Rodrigues, P. C., de Souza, G. P., Neto, J. D. D. & Akcelrud, L. "Thermal Treatment And Dynamic Mechanical Thermal Properties Of Polyaniline", *Polymer* 43, 5493-5499 (2002); Kieffel, Y., Travers, J. P., Ermolieff, A. & Rouchon, D. "Thermal Aging Of Undoped Polyaniline: Effect Of Chemical Degradation On Electrical Properties", *J. Appl. Polym. Sci.* 86, 395-404 (2002); Tan, H. H., Neoh, K. G., Liu, F. T., Kocherginsky, N. & Kang, E. T. "Crosslinking And Its Effects On Polyaniline Films", *J. Appl. Polym. Sci.* 80, 1-9 (2001); Liu, G. & Freund, M. S. "New Approach For The Controlled Cross-Linking Of Polyaniline: Synthesis And Characterization", *Macromolecules*, 5660-5665 (1997); Conklin, J. A., Huang, S. C., Huang, S. M., Wen, T. L. & Kaner, R. B. "Thermal-Properties of Polyaniline and Poly (Aniline-Co-O-Ethylaniline)", *Macromolecules* 28, 6522-6527 (1995)) flash welding through a mask represents a convenient way to fabricate polymer films into pre-designed patterns, which is especially useful for organic micro/nano devices.

Figure 13:
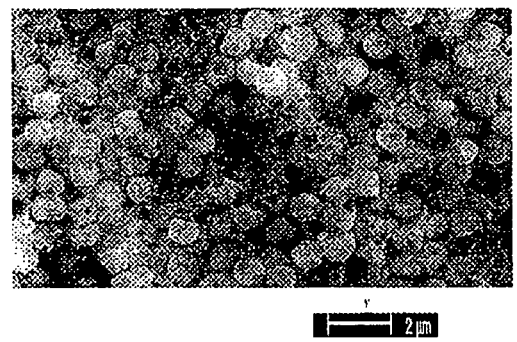
FIG. 13 is an SEM image of a mixture of polyaniline fibers and polystyrene spheres.
Figure 14:
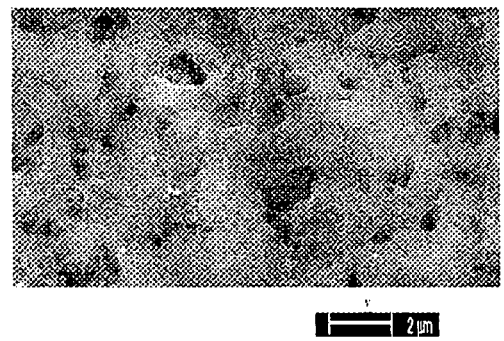
FIG. 14 is an SEM image of a mixture of polyaniline fibers and polystyrene spheres of FIG. 13 after flash welding.
Figure 15:
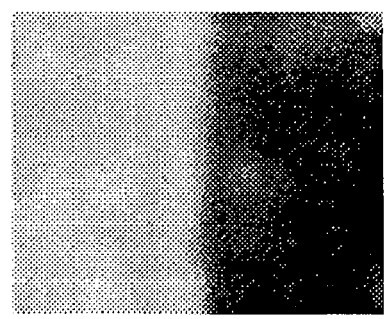
FIG. 15 is a visual image of the mat of nanofibers and polystyrene spheres before and after exposure, the left, lighter image being the unexposed mixture and the left, darker image showing the appearance and color change after exposure.

The heat generated in the nanofibers during a camera flash can also be employed to weld polyaniline to another polymer, offering a rapid and clean optical technique for welding different polymers together. This concept was demonstrated by flash welding of polyaniline nanofibers onto polystyrene spheres. Polyaniline nanofibers and polystyrene microspheres (~1 μm in diameter) were mixed in water and films of a random polyaniline-polystyrene mixture were made by drop casting. Polyaniline nanofibers were synthesized using interfacial polymerization as described above. Thin films of nanofibers were made by drop-casting a water dispersion of nanofibers onto a flat substrate (e.g. silicon wafer). Polystyrene spheres and Teflon® particles were mixed with polyaniline fibers and flash welding experiments were carried out using a photographic camera flash. The cast films look white due to strong light scattering (FIG. 15, left portion), since there is a significant amount of polystyrene beads on the surface as confirmed by the SEM image (FIG. 13). The cast film has a blue hue due to the underlying color of undoped polyaniline which was used in the blend. After irradiation by high intensity light from a camera flash, the nanofibers and microspheres fused together, leading to a dark blue colored film (FIG. 14 and FIG. 15, right side). Flash welding can be used for making polymer-polymer blends and offers a novel method to embed guest polymer particles into a host matrix. Even polytetrafluoroethylene (Teflon®) particles can be mixed with and welded to polyaniline nanofibers.

A photographic flash produces a relatively high intensity light within a short pulse (~1 ms). (Rosencwaig, ibid., Ajayan, ibid.). Although the energy is insufficient to melt the bulk polymer, local hot spots are likely. In single walled carbon nanotubes and silicon nanowires, local hot spots of above 1500° C. may occur as a result of flash irradiation (Rosencwaig, ibid.; Ajayan, ibid. Smits, J.; Wincheski, B., Namkung, M., Crooks, R. & Louie, R. "Response Of Fe Powder, Purified And As-Produced Hipco Single-Walled Carbon Nanotubes To Flash Exposure", *Mater: Sci. & Eng., A* 358, 384-389 (2003); Braidy, N., Botton, G. A. & Adronov, A. "Oxidation Of Fe Nanoparticles Embedded In Single-Walled Carbon Nanotubes By Exposure To A Bright Flash Of White Light", *Nano Lett.* 2, 1277-1280 (2002)). One possible explanation for the ability to flash weld polyaniline nanofibers is that hot spots can form around the chromophores on the polyaniline chains as they absorb visible light due to highly efficient photothermal conversion of polyaniline, which may further initiate and propagate exothermic cross-linking reactions between polymer chains. Since polyaniline has a low thermal conductivity (~$10^{-1}$ W/mK), the heat from photothermal conversion and cross-linking reactions could accumulate within the nano-sized domains leading to the welding of nanofibers. In contrast to carbon nanotubes and silicon nanowires, slight burning of the nanofibers only occurs when the flash is very close (within 0.5 cm) and is visible as smoke coming off of the nanofibers. Melting of the polymer nanofibers may act as a benign way to drain the pulsed heat away avoiding complete structural breakdown or combustion, thus enabling many potentially useful applications.

The absorption of light by a material generates heat through nonradiative energy dissipation and exothermic photochemical reactions. In the case of nanostructured materials, the thermal energy generated by photon absorption is confined to the nanostructured region. Heat transfer to proximal nanostructures and the environment is relatively slow. The result is unprecedented photothermal effects not observed in bulk materials. This effect is greatly enhanced if the photothermal source is a pulsed light such as a camera flash or laser.

Figure 17:
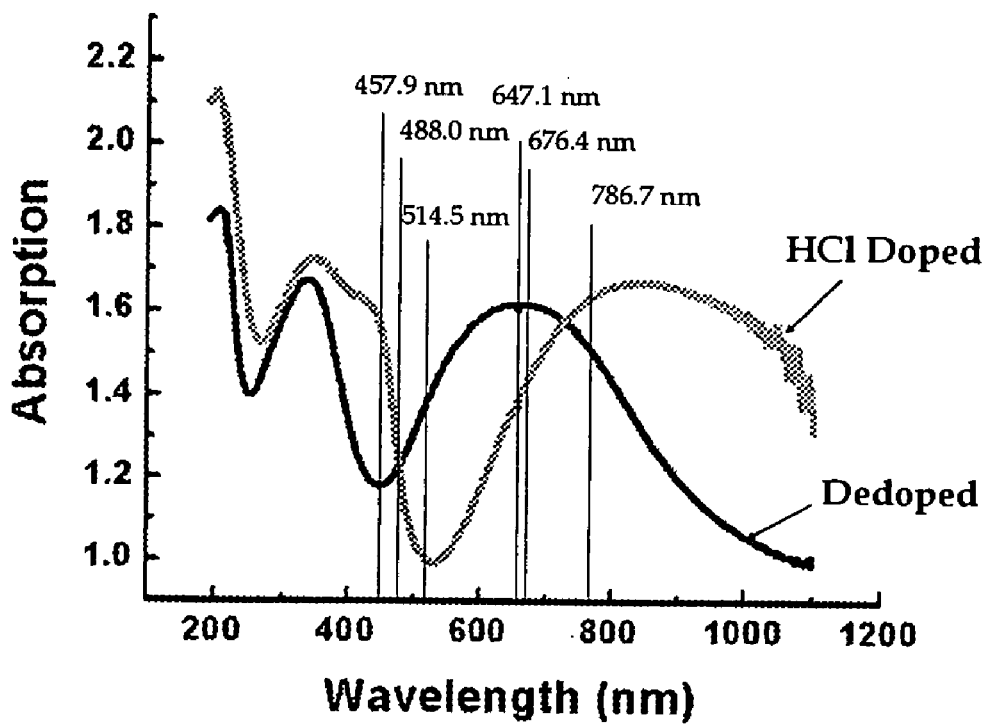
FIG. 17 is a graph showing laser excitation wavelength vs. absorption spectra of the doped and de-doped polyaniline nanofibers.

When polyaniline is doped with an acid there is a pronounced change in the electronic absorption spectrum. The absorption spectra of the HCl doped and dedoped (doping with HCl and then neutralized with base) polyaniline nanofiber material is shown in FIG. 17. The HCl doped material has considerably more absorption capability at longer wavelengths (>800 nm) than the dedoped material. Accordingly, the dependence of "flash welding" on excitation wavelength, excitation power and excitation pulse duration and thermal vs. photochemical mechanisms was evaluated.

A continuous wave laser and pulsed laser excitation sources were used to evaluate these phenomena and relationships between cause and effect. The difference in the physical surface appearance of the nanostructured film between the nonwelded material and the flash welded material was used to provide a clear experimental end point to determine wavelength and power dependence.

A Coherent Innova 90C-5 Argon Ion laser was used for excitation wavelengths 457.9 nm, 476.5 nm, 488.0 nm and 514.5 nm., a Coherent Innova 90 Krypton Ion laser was used for the excitation wavelengths 647.1 nm and 676.4 nm. The laser beam was focused and unfocused to effect a change in the photon flux.

Materials were cast onto a silicon substrate. The excitation source was placed directly onto the thin film surface (focused and unfocused modes) and the laser power was increased until the "flash welding" was observed. This procedure was performed at excitation wavelengths: 767.4 nm, 647.1 nm, 514.5 nm, 488.0 nm and 457.9 nm. The laser excitation wavelengths vs. absorption bands are shown in FIG. 17. It was found that at wavelengths where the material has a high absorption characteristic, the laser power required to achieve flash welding was lower than at wavelengths were the material has a low absorption characteristic.

The results for the full wavelength and power dependence experiments for the HCl doped polyaniline nanofiber material is shown in Table 1. The data show a clear wavelength and power dependence of the "flash welding" phenomenon on the absorption characteristics. The HCl doped material has an absorption minimum around 520 nm and the 514.5 nm laser excitation line requires more power than the surrounding wavelengths, 647.1 nm and 488.0 nm.

TABLE 1

WAVELENGTH AND POWER DEPENDENCE DATA
HCL DOPED POLYANILINE NANOFIBER MATERIAL

| Laser Excitation Wavelength | Power Threshold | No Flash Welding |
|---|---|---|
| 676.4 nm | 8 mW | 7 mW |
| 647.1 nm | 7 mW | 6 mW |
| 514.5 nm | 17 mW | 16 mW |
| 488.0 nm | 6 mW | 5 mW |
| 457.9 nm | 3 mW | 2 mW |

A wavelength and power dependence study was also performed on dedoped material at the laser excitation wavelengths 514.5 nm, 488.0 nm, 476.5 nm and 457.9 nm. The results are shown in Table 2.

TABLE 2

WAVELENGTH AND POWER DEPENDENCE DATA
HCL DEDOPED POLYANILINE NANOFIBER MATERIAL

| Laser Excitation Wavelength | Power Threshold | No Flash Welding |
|---|---|---|
| 514.5 nm | 4 mW | 3 mW |
| 488.0 nm | 5 mW | 4 mW |
| 476.5 nm | 6 mW | 5 mW |
| 457.9 nm | 6 mW | 5 mW |

Flash welding is not limited to pure nanofiber compositions; camera flash treatment of fine conventional polyaniline powders also produces a photoacoustic response likely due to the presence of a small amount of nano-sized features. Such nanostructures become "smoothed" out after flash welding. Preliminary tests on polyaniline derivatives and other conducting polymers such as polypyrrole and polythiophene indicate that camera flash irradiation is capable of welding them when sub-100 nm nanostructures are present. Flash welding appears to be a general phenomenon for materials with a high absorbance (deeply colored), high photothermal efficiency (low emission), low thermal conductivity and small size. It can be used for making asymmetric membranes, photo-patterning nanostructured films and welding polymer-polymer and polymer-inorganic nanocomposites.

While polyaniline nanofibers have been used to demonstrate flash welding, the procedure is not limited to polyaniline and has been shown to also occur in mats formed from nanofibers of polytoluidine and other polyaniline derivatives, and is likely to occur in nanofibers of other conjugated polymers, including, but not limited to, poly(N-vinylcarbazole), polyacetylene, polypyrrole, polythiophene, poly(2-vinylpyridine) and poly(p-phenylenevinylene), and derivatives and polymer blends including one or more of these materials. Also, while two techniques for forming the polyaniline nanofibers where disclosed, the flash welding process is not limited to nanofibers formed by the disclosed processes and one skilled in the art will recognize that other methods to form nanofibers exist or may be developed in the future. The nanofibers produced by these other methods will likewise be suitable for flash welding. Still further, while the examples provided describe the use of light in the visible range, it is also contemplated, depending on the chemical composition of the polymer comprised of the nanofibers, that non-visible radiation, for example in the ultraviolet or infrared frequency range, could also be used to flash weld the nanofibers.

We claim:

1. A process for welding together nanofibers consisting of one or more thermosetting conjugated electrically conductive polymers, the nanofibers collected as a random mat, comprising exposing the random mat of said nanofibers of said one or more thermosetting polymers to a burst of a high intensity flash of light.

2. The process of claim 1 wherein the burst of light is from about 1 microsecond to about 10 milliseconds in duration.

3. The process of claim 1 wherein the intensity of the flash of light is from about 0.1 J/cm$^2$ to about 1 J/cm$^2$.

4. The process of claim 1 wherein the light has a wavelength in the range from about 200 nm to about 900 nm.

5. The process of claim 1 wherein the high intensity flash of light comprises a burst of light of from about 1 microsecond to about 10 milliseconds with an intensity of from about 0.1 J/cm$^2$ to about 1 J/cm$^2$ and a wavelength in the range from about 200 nm to about 900 nm.

6. The process of claim 5 wherein the high intensity flash of light has a duration of about 5 msec.

7. The process of claim 1 wherein the one or more conjugated thermosetting electrically conductive polymer is selected from the group consisting of one or more of polyaniline, poly(N-vinylcarbazole), polyacetylene, polypyrrole, polythiophene, poly(2-vinylpyridine) and poly(p-phenylenevinylene).

8. The process of claim 1 wherein a predetermined pattern of welded nanofibers is formed on the surface of the mat by placing a patterned shield which is non-transparent to the high intensity flash of light on or above the surface of the mat of nanofibers prior to exposure of the mat to the burst of light, that portion of the mat not shielded becoming welded.

9. The process of claim 1 wherein the mat of nanofibers further includes one of more additional materials dispersed therein said additional materials not melted by the burst of the high intensity flash of light, the nanofibers becoming flash welded to said additional materials by exposure to the high intensity flash of light.

10. The process of claim 1 wherein the burst of light is about 1 milliseconds in duration.

11. The process of claim 1 wherein the burst of a high intensity flash of light is provided by a camera flash unit.

12. A method of welding nanofibers within a mat together or to other materials dispersed in the mat with said nanofibers comprising
 a. forming a random mat of nanofibers or nanofibers and other materials, and
 b. exposing at least a portion of the nanofibers at the surface of said mat to a burst of a high intensity flash of light, wherein the nanofibers consist of one or more thermosetting conjugated electrically conductive polymers.

13. The method of claim 12 for welding the mat of nanofibers together wherein the nanofibers, or the mat of nanofibers, are composed of one or more thermosetting conjugated electrically conductive polymers selected from the group consisting of polyaniline, poly(N-vinylcarbazole), polyacetylene, polypyrrole, polythiophene, poly(2-vinylpyridine) and poly (p-phenylenevinylene).

14. The method of claim 12 for welding the mat of nanofibers together wherein the thermosetting conjugated electrically conductive polymer is polyaniline and the exposure of the mat of polyaniline nanofibers to the flash of light causes contacting surfaces of the nanofibers exposed to said flash of light to fuse to form an asymmetric, continuous film with a smooth surface, the exposed polyaniline polymer to crosslink and the exposed polyaniline to become insoluble in DMF.

15. The method of claim 12 for welding the mat of nanofibers wherein the high intensity flash of light comprises a burst of light of from about 1 microsecond to about 10 milliseconds with an intensity of from about 0.1 J/cm$^2$ to about 1 J/cm$^2$ and a wavelength in the range from about 200 nm to about 900 nm.

* * * * *